US006547885B1

(12) United States Patent
Swain

(10) Patent No.: US 6,547,885 B1
(45) Date of Patent: Apr. 15, 2003

(54) MULTIPURPOSE DRAFT SHIELD APPARATUS

(75) Inventor: Eugene A. Swain, Webster, NY (US)

(73) Assignee: Xerox Corporation, Stamford, CT (US)

( * ) Notice: Subject to any disclaimer, the term of this patent is extended or adjusted under 35 U.S.C. 154(b) by 278 days.

(21) Appl. No.: 09/692,876

(22) Filed: Oct. 20, 2000

(51) Int. Cl.7 .......... C23C 16/00
(52) U.S. Cl. .......... 118/715; 118/504; 118/500
(58) Field of Search .......... 118/429, 404, 118/715, 405, 726, 727, DIG. 11, 728, 500, 501, 504, 407

(56) References Cited

U.S. PATENT DOCUMENTS

| | | | | |
|---|---|---|---|---|
| 4,531,959 A | * 7/1985 | Kar et al. | | |
| 4,548,567 A | * 10/1985 | Missout | | |
| 5,720,815 A | 2/1998 | Swain | | 118/407 |
| 5,725,667 A | 3/1998 | Petropoulos et al. | | 118/407 |

* cited by examiner

*Primary Examiner*—Brenda A. Lamb
(74) *Attorney, Agent, or Firm*—Zosan S. Soong

(57) ABSTRACT

A draft shield apparatus having a longitudinal axis including:

an open upper end section defining a substrate entry end, an open lower end section defining a substrate exit end, and a central section between the upper end section and the lower end section, the apparatus defining a passageway which extends through the upper end section, the central section, and the lower end section along the longitudinal axis to result in an upper end section inner surface, a central section inner surface, and a lower end section inner surface, wherein the passageway has a width sufficiently large to permit movement of at least a portion of a substrate through the apparatus;

wherein the upper end section inner surface is inclined towards the longitudinal axis, wherein the lower end section inner surface is inclined towards the longitudinal axis and the lower end section inner surface extends into the passageway such that the width of the substrate exit end is smaller than the width of the substrate entry end.

10 Claims, 4 Drawing Sheets

MULTIPURPOSE DRAFT SHIELD APPARATUS

BACKGROUND OF THE INVENTION

Draft shields are utilized in dip coating systems. Their purpose is to prevent air currents from impinging on the wet coating because such air currents may create non-uniformities in the coating thickness. As seen in FIG. 1, a problem with a conventional draft shield 2 defining a vertical passageway 4 is that during the dip coating process a non-vertical substrate 6 (due to for example improper chucking with a holding device 7 or interference with another object, and the like) may strike the draft shield 2 or the dip coating vessel 8, thereby causing damage to the substrate, the draft shield, and/or the dip coating vessel.

A further problem with a conventional draft shield during the dip coating process is seen in FIG. 2 where the presence of the draft shield 2 results in a vapor density gradient (the vapor coming from the coating solution 13 and the wet coating 14) composed of highest vapor density region 12 above the coating solution 13, intermediate vapor density region 10 in the passageway 4, and the lowest vapor density region 11 for the ambient air outside the draft shield 2. A substrate having a wet coating 14 when subjected to a relatively abrupt change in vapor density from intermediate vapor density region 10 to lowest vapor density region 11 may create non-uniformities in the coating thickness.

A new draft shield is needed which avoids or minimizes the above discussed problems.

Conventional draft shields and dip coating systems are described in Petropoulos et al., U.S. Pat. No. 5,725,667 and Swain, U.S. Pat. No. 5,720,815.

SUMMARY OF THE INVENTION

The present invention is accomplished in embodiments by providing a draft shield apparatus having a longitudinal axis comprising:

an open upper end section defining a substrate entry end, an open lower end section defining a substrate exit end, and a central section between the upper end section and the lower end section, the apparatus defining a passageway which extends through the upper end section, the central section, and the lower end section along the longitudinal axis to result in an upper end section inner surface, a central section inner surface, and a lower end section inner surface, wherein the passageway has a width sufficiently large to permit movement of at least a portion of a substrate through the apparatus;

wherein the upper end section inner surface is inclined towards the longitudinal axis, wherein the lower end section inner surface is inclined towards the longitudinal axis and the lower end section inner surface extends into the passageway such that the width of the substrate exit end is smaller than the width of the substrate entry end.

There is also provided in embodiments a coating system comprising:

(a) a coating vessel defining an opening;

(b) a draft shield apparatus having a longitudinal axis which is positioned above the coating vessel opening, comprising:

an open upper end section defining a substrate entry end, an open lower end section defining a substrate exit end, and a central section between the upper end section and the lower end section, the apparatus defining a passageway which extends through the upper end section, the central section, and the lower end section along the longitudinal axis to result an upper end section inner surface, a central section inner surface, and a lower end section inner surface, wherein the passageway has a width sufficiently large to permit movement of at least a portion of a substrate through the apparatus;

wherein the upper end section inner surface is inclined towards the longitudinal axis, wherein the lower end section inner surface is inclined towards the longitudinal axis such that the width of the substrate exit end is smaller than the width of the substrate entry end; and (c) a coating solution disposed in the vessel that gives off a vapor which floats into the passageway defined by the apparatus, wherein the portion of the passageway defined by the upper end section inner surface is a lower vapor density region, and the portions of the passageway defined by the central section inner surface and the lower end section inner surface are a higher vapor density region.

BRIEF DESCRIPTION OF THE DRAWINGS

Other aspects of the present invention will become apparent as the following description proceeds and upon reference to the Figures which represent preferred embodiments.

Unless otherwise noted, the same reference numeral in different Figures refers to the same or similar feature.

DETAILED DESCRIPTION

Figure 3:
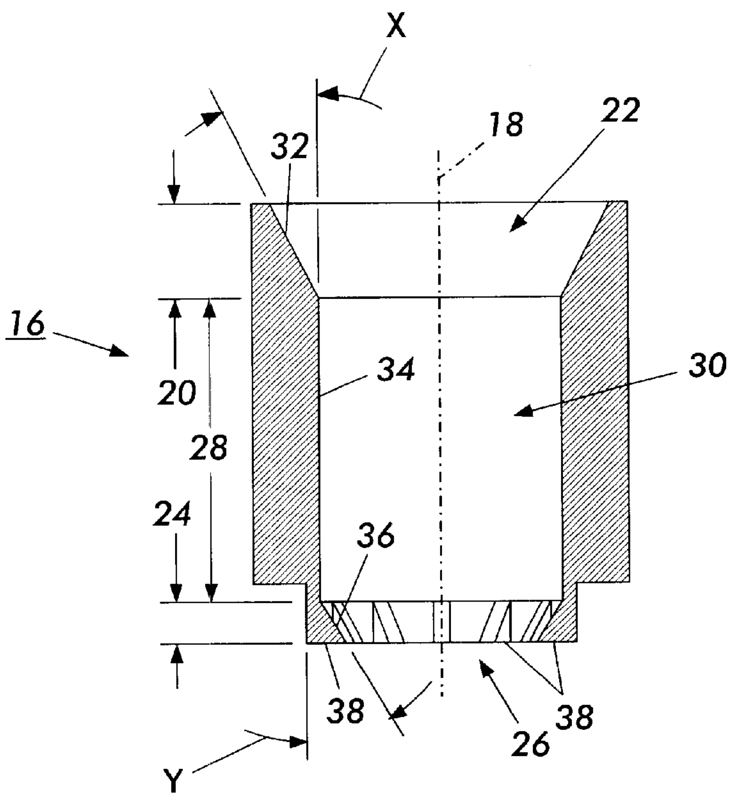
FIG. 3 is a simplified, elevational view in cross-section of the present draft shield apparatus.
Figure 4:
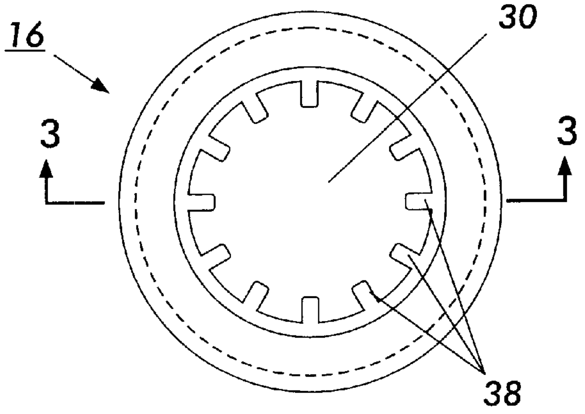
FIG. 4 is a simplified end view of the present draft shield apparatus.

FIGS. 3–4 illustrate a preferred embodiment of the present draft shield apparatus 16 having a longitudinal axis 18 composed of: an open upper end section 20 defining a substrate entry end 22, an open lower end section 24 defining a substrate exit end 26, and a central section 28 between the upper end section and the lower end section, the draft shield apparatus 16 defining a passageway 30 which extends through the upper end section 20, the central section 28, and the lower end section 24 along the longitudinal axis 18 to result in an upper end section inner surface 32, a central section inner surface 34, and a lower end section inner surface 36, wherein the passageway has a width sufficiently large to permit movement of at least a portion of a substrate 6 through the draft shield apparatus; wherein the upper end section inner surface 32 is inclined towards the longitudinal axis 18; and wherein the lower end section inner surface 36 is inclined towards the longitudinal axis 18 and the lower end section inner surface extends into the passageway such that the width of the substrate exit end 26 is smaller than the width of the substrate entry end 22.

The central section inner surface 34 is preferably parallel to the longitudinal axis 18, but in another embodiment the central section inner surface can be slightly tapered such as inclined towards the longitudinal axis. In embodiments, the central section may be a screen having a plurality of openings. The screen may be made of for example stainless steel. The function of the screen is to allow the escape of a controlled amount of vapor while preventing air current from impinging on the surface of the wet coating. Therefore, the screen must be very fine, perferably from about 50 to about 200 microinch openings, but most preferably from about 70 to about 80 microinch openings.

Figure 1:
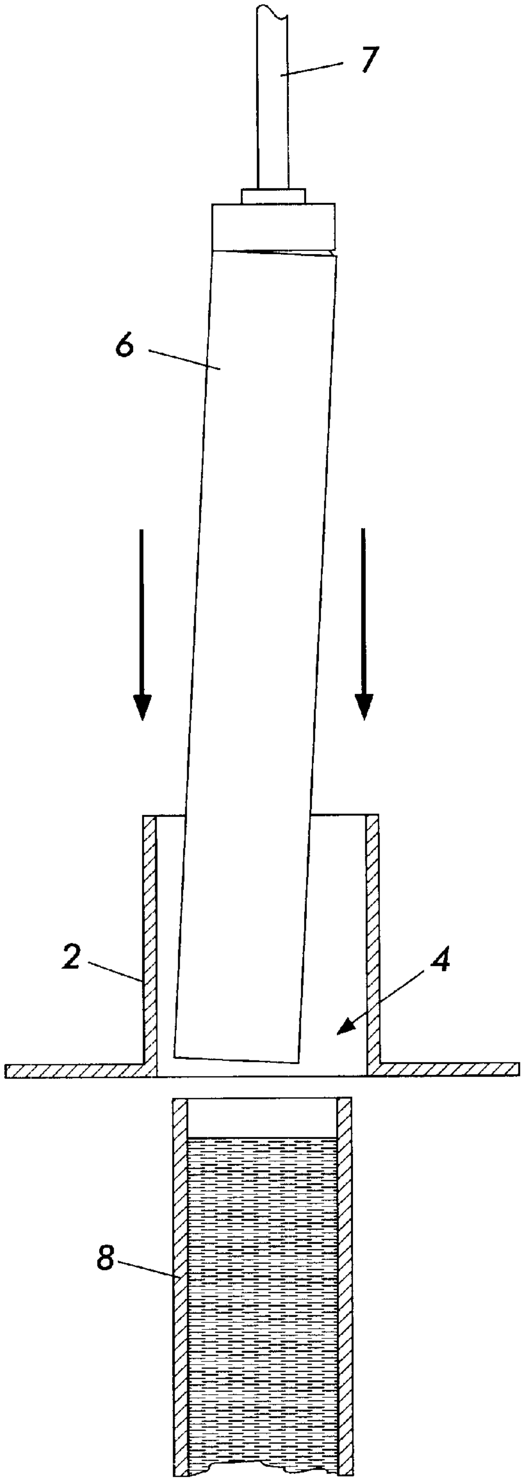
FIG. 1 PRIOR ART
FIG. 1 is a simplified, elevational view of a misaligned substrate engaging a conventional coating system composed of a draft shield positioned over a coating vessel.
Figure 2:
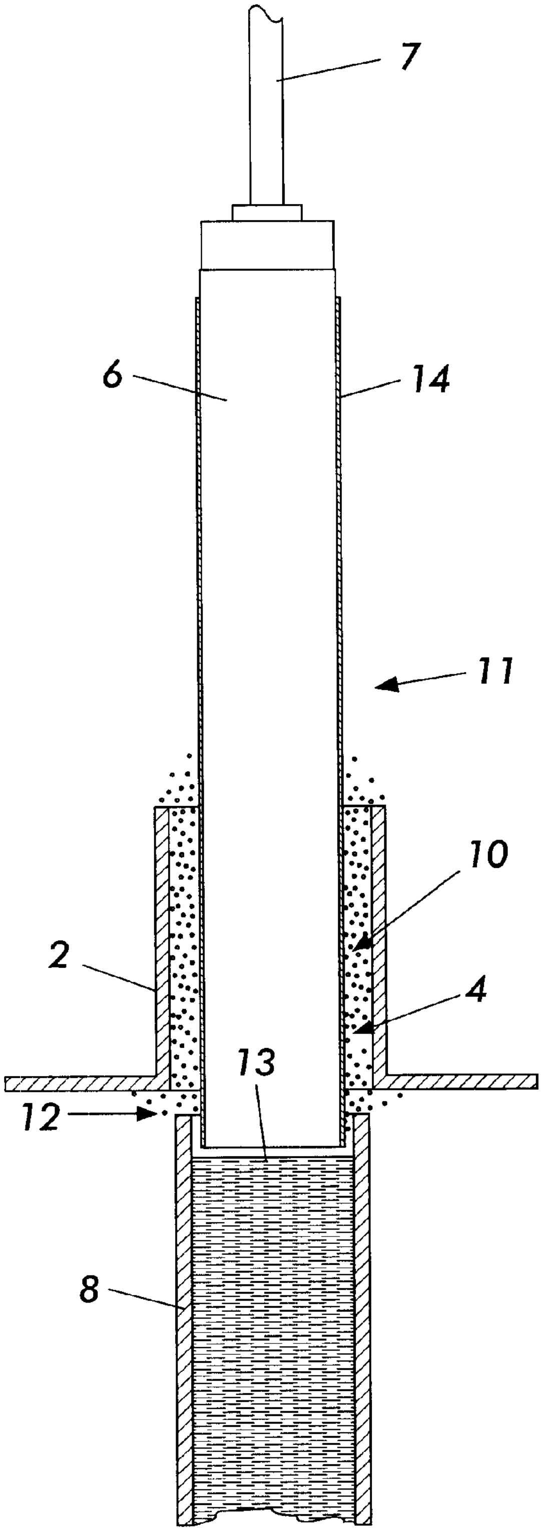
FIG. 2 PRIOR ART
FIG. 2 is a simplified, elevational view of the conventional coating system of FIG. 1 with a substrate disposed within the conventional draft shield.

As seen in FIGS. 1–2, the lower end section 24 may be composed of a plurality of individual ramps 38, which may be evenly spaced apart from one another. The number of ramps may range for example from 6 to 20. In another embodiment, the lower end section, however, may be a single continuous ramp.

The incline angle X of the upper end section inner surface may be the same or different from the incline angle Y of the lower end section inner surface. The incline angles (X,Y) may range for example from about 20 degrees to about 60 degrees, preferably from about 30 degrees to about 50 degrees, and more preferably about 30 degrees.

The passageway 30 may have a circular circumference or any suitable shape to accommodate passage of at least a portion of the substrate. The passageway preferably has a width sufficiently large to permit movement of the entire substrate 6 through the draft shield apparatus. In the passageway, the distance between the substrate outer surface and each of the upper end section inner surface, the central section inner surface, and the lower end section inner surface may range for example from about 5 mm to about 3 cm, preferably from about 10 mm to about 1 cm.

In embodiments, a protective coating is formed on the draft shield apparatus to prevent it from corroding or oxidizing. The protective coating may be an anodized aluminum layer which is porous. The pores are then filled with fine particles of polytetrafluoroethylene. The protective coating is optional for the draft shield apparatus but makes it easy to clean and provides an inert surface. The thickness of the protective coating is approximately 0.0015 inch. Other materials for the protective coating are for instance chrome, nickel, and copper.

The draft shield apparatus may be a single piece or multiple pieces that are coupled together by for example an adhesive, welding, and/or connectors (e.g., screws, nuts and bolts).

Figure 5:
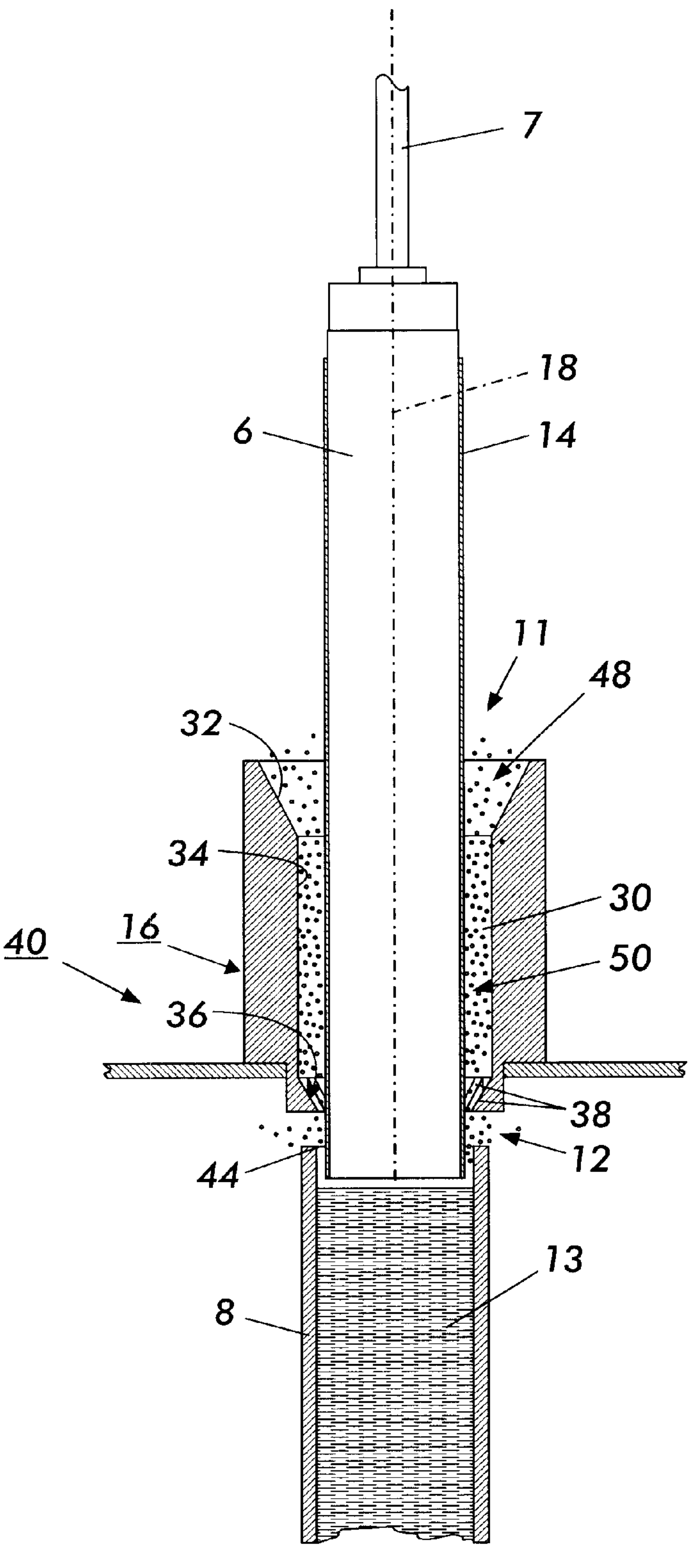
FIG. 5 is a simplified, elevational view of the present coating system with a substrate disposed within the present draft shield apparatus.

FIG. 5 depicts a coating system 40 composed of: (a) a coating vessel 8 defining an opening 44; (b) the present draft shield apparatus 16 which is positioned above the coating vessel opening 44; and (c) a coating solution 13 disposed in the vessel that gives off a vapor which floats into the passageway 30 defined by the draft shield apparatus.

The presence of the draft shield apparatus 16 results in a vapor density gradient (the vapor coming from the coating solution 13 and the wet coating 14) composed of highest vapor density region 12 above the coating solution 13, higher intermediate vapor density region 50 in the passageway 4, lower intermediate vapor density region 48, and the lowest vapor density region 11 for the ambient air outside the draft shield apparatus 16. A substrate having a wet coating 14 when subjected to a relatively less abrupt change in vapor density from lower intermediate vapor density region 48 to lowest vapor density region 11 may have fewer non-uniformities in the coating thickness, as compared with the vapor density gradient resulting from conventional draft shield 2 of FIG. 2.

During the dip coating process, the vapor density is important to the thickness uniformity of the resulting wet coating. The vapor density varies at different locations from the surface of the coating solution. The vapor density is the highest very close to the surface of the coating solution due to the continuous evaporation of the solution surface. It is less dense inside the draft shield apparatus due to the limited amount of wet coating on the substrate, i.e., there is only a limited amount of solvent to evaporate, especially for very thin coatings. In the case where most of the solvent has not evaporated, nonuniformities can result from continuous sagging of the coating since it is still wet. Within the present draft shield apparatus, the vapor density gradually decreases due to the increasing volume of space which contains the limited amount of evaporating solvent. This promotes even flash off and uniform drying of the coating as it exits the draft shield apparatus, thereby limiting the sagging of the coating.

Operation of the draft shield apparatus and coating system proceed as follows. When a misaligned substrate is inserted into the draft shield apparatus, the lower edge of the substrate contacts the inclined upper end section inner surface. As the lower edge of the substrate rides down the inclined upper end section inner surface, the substrate becomes more vertically aligned with the longitudinal axis. Preferably, the substrate is sufficiently aligned with the longitudinal axis after riding down the inclined upper end section inner surface such that the lower edge of the substrate does not contact the central section inner surface as the substrate moves down the passageway. In some cases, however, the lower edge of the substrate may contact and ride down the central section inner surface as the substrate moves down the passageway. Thus, the inclined upper end section inner surface prevents or minimizes damaging contact between a misaligned substrate and the draft shield apparatus as the substrate is inserted into the draft shield apparatus.

Prior to reaching the inclined lower end section inner surface, the substrate may still be slightly misaligned (i.e., where the lower edge of the substrate will contact the top or side wall of the coating vessel when the substrate is lowered into the coating vessel). As the slightly misaligned substrate moves further down into the passageway, the lower edge of the substrate contacts the inclined lower end section inner surface. As the the lower edge of the substrate rides down the inclined lower end section inner surface, the substrate becomes more vertically aligned with the longitudinal axis. Preferably, the substrate is sufficiently aligned with the longitudinal axis after riding down the inclined lower end section inner surface such that the lower edge of the substrate does not contact either the top or side wall of the coating vessel when the substrate is lowered into the coating vessel. Thus, the inclined lower end section inner surface prevents or minimizes damaging contact between a misaligned substrate and the coating vessel as the substrate is inserted into the coating vessel.

Continuing the dip coating process, the substrate is then pulled up from the coating solution to result in a wet coating on the substrate. The substrate is pulled up through the passageway of the draft shield apparatus. Generally, the substrate is properly aligned such that the top edge of the substrate does not contact the draft shield apparatus at either the lower end section inner surface, the central section inner surface, or the upper end section inner surface.

Another function of the present draft shield apparatus is to prevent or to minimize air currents from impinging on the wet coating because such air currents may create non-uniformities in the coating thickness.

The substrate can be formulated entirely of an electrically conductive material, or it can be an insulating material having an electrically conductive surface. The substrate can be opaque or substantially transparent and can comprise numerous suitable materials having the desired mechanical properties. The entire substrate can comprise the same material as that in the electrically conductive surface or the electrically conductive surface can merely be a coating on the substrate. Any suitable electrically conductive material can be employed. Typical electrically conductive materials include metals like copper, brass, nickel, zinc, chromium, stainless steel; and conductive plastics and rubbers, aluminum, semitransparent aluminum, steel, cadmium, titanium, silver, gold, paper rendered conductive by the inclusion of a suitable material therein or through conditioning in a humid atmosphere to ensure the presence of sufficient water content to render the material conductive, indium, tin, metal oxides, including tin oxide and indium tin oxide, and the like. The substrate layer can vary in thickness over substantially wide ranges depending on the desired use of the photoconductive member. Generally, the conductive layer ranges in thickness of from about 50 Angstroms to 10 mm, although the thickness can be outside of this range. When a flexible electrophotographic imaging member is desired, the substrate thickness typically is from about 0.015 mm to about 0.15 mm. The substrate can be fabricated from any other conventional material, including organic and inorganic materials. Typical substrate materials include insulating non-conducting materials such as various resins known for this purpose including polycarbonates, polyamides, polyurethanes, paper, glass, plastic, polyesters such as MYLAR™ (available from DuPont) or MELINEX™ 447 (available from ICI Americas, Inc.), and the like. If desired, a conductive substrate can be coated onto an insulating material. In addition, the substrate can comprise a metallized plastic, such as titanized or aluminized MYLAR™. The coated or uncoated substrate can be flexible or rigid, and can have any number of configurations such as a cylindrical drum, an endless flexible belt, and the like. The substrates preferably have a hollow, endless configuration.

The coating solution may comprise materials typically used for any layer of a photosensitive member including such layers as a subbing layer, a charge blocking layer, an adhesive layer, a charge transport layer, and a charge generating layer, such materials and amounts thereof being illustrated for instance in U.S. Pat. No. 4,265,990, U.S. Pat. No. 4,390,611, U.S. Pat. No. 4,551,404, U.S. Pat. No. 4,588,667, U.S. Pat. No. 4,596,754, and U.S. Pat. No. 4,797,337, the disclosures of which are totally incorporated by reference. In embodiments, the coating solution may be formed by dispersing a charge generating material selected from azo pigments such as Sudan Red, Dian Blue, Janus Green B, and the like; quinone pigments such as Algol Yellow, Pyrene Quinone, Indanthrene Brilliant Violet RRP, and the like; quinocyanine pigments; perylene pigments; indigo pigments such as indigo, thioindigo, and the like; bisbenzoimidazole pigments such as Indofast Orange, and the like; phthalocyanine pigments such as copper phthalocyanine, aluminochlorophthalocyanine, and the like; quinacridone pigments; or azulene compounds in a binder resin such as polyester, polystyrene, polyvinyl butyral, polyvinyl pyrrolidone, methyl cellulose, polyacrylates, cellulose esters, and the like. In embodiments, the coating solution may be formed by dissolving a charge transport material selected from compounds having in the main chain or the side chain a polycyclic aromatic ring such as anthracene, pyrene, phenanthrene, coronene, and the like, or a nitrogen-containing hetero ring such as indole, carbazole, oxazole, isoxazole, thiazole, imidazole, pyrazole, oxadiazole, pyrazoline, thiadiazole, triazole, and the like, and hydrazone compounds in a resin having a film-forming property. Such resins may include polycarbonate, polymethacrylates, polyarylate, polystyrene, polyester, polysulfone, styrene-acrylonitrile copolymer, styrene-methyl methacrylate copolymer, and the like. The coating solution may also contain an organic solvent such as one or more of the following: tetrahydrofuran, monochlorobenzene, and cyclohexanone. An illustrative charge transport layer coating solution has the following composition: 10% by weight N,N'-diphenyl-N,N'-bis(3-methylphenyl)-(1,1'-biphenyl)-4,4'diamine; 14% by weight poly(4,4'-diphenyl-1,1'-cyclohexane) carbonate (400 molecular weight); 57% by weight tetrahydrofuran; and 19% by weight monochlorobenzene. A representative charge generating material coating solution comprises: 2% by weight hydroxy gallium phthalocyanine; 1% by weight terpolymer of vinyl acetate, vinyl chloride, and maleic acid; and 97% by weight cyclohexanone.

Other modifications of the present invention may occur to those skilled in the art based upon a reading of the present disclosure and these modifications are intended to be included within the scope of the present invention.

I claim:

1. A coating system for coating a substrate comprising:

(a) a coating vessel defining an opening;

(b) a draft shield apparatus having a longitudinal axis which is positioned above the coating vessel opening, comprising:

an open upper end section defining a substrate entry end, an open lower end section defining a substrate exit end, and a central section between the upper end section and the lower end section, the apparatus defining a passageway which extends through the upper end section, the central section, and the lower end section along the longitudinal axis to result an upper end section inner surface, a central section inner surface, and a lower end section inner surface, wherein the passageway has a width sufficiently large to permit movement of at least a portion of a substrate through the apparatus;

wherein the upper end section inner surface is inclined towards the longitudinal axis, wherein the lower end section inner surface is inclined towards the longitudinal axis such that the width of the substrate exit end is smaller than the width of the substrate entry end; and (c) a coating solution for the substrate disposed in the vessel that gives off a vapor which floats into the passageway defined by the apparatus, wherein the portion of the passageway defined by the upper end section inner surface is a lower vapor density region, and the portions of the passageway defined by the central section inner surface and the lower end section inner surface are a higher vapor density region.

2. The coating system of claim 1, wherein the width of the substrate exit end of the lower end section is smaller than the width of the coating vessel opening.

3. The coating system of claim 1, wherein the central section inner surface is parallel to the longitudinal axis.

4. The coating system of claim 1, wherein the central section is a screen having a plurality of openings.

5. The coating system of claim 1, wherein the apparatus is a single piece.

6. The coating system of claim 1, wherein the lower end section is comprised of a plurality of ramps.

7. The coating system of claim 1, wherein the ramps are evenly spaced apart from one another.

8. The coating system of claim 1, wherein the passageway has a width sufficiently large to permit movement of the entire substrate through the apparatus.

9. The coating system of claim 1, wherein the incline angle of the upper end section inner surface is different from the incline angle of the lower end section inner surface.

10. The coating system of claim 1, wherein the incline angle of the upper end section inner surface is the same as the incline angle of the lower end section inner surface.

* * * * *